(12) United States Patent
Fujii et al.

(10) Patent No.: US 7,356,894 B2
(45) Date of Patent: Apr. 15, 2008

(54) METHOD OF PRODUCING A MICRO-ACTUATOR

(75) Inventors: Masanao Fujii, Kawasaki (JP); Toru Okada, Kawasaki (JP); Masayuki Kitajima, Kawasaki (JP); Hidehiko Kobayashi, Kawasaki (JP); Seiichi Shimoura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 449 days.

(21) Appl. No.: 11/006,340

(22) Filed: Dec. 7, 2004

(65) Prior Publication Data

US 2005/0104477 A1 May 19, 2005

Related U.S. Application Data

(62) Division of application No. 10/459,955, filed on Jun. 12, 2003, now Pat. No. 6,848,154, which is a division of application No. 09/822,621, filed on Mar. 30, 2001, now Pat. No. 6,653,761.

(30) Foreign Application Priority Data

Nov. 2, 2000 (JP) .............................. 2000-335868

(51) Int. Cl.
*H01L 41/22* (2006.01)
*H01L 41/00* (2006.01)

(52) U.S. Cl. .................... 29/25.35; 29/594; 29/830; 29/831; 29/832; 310/328

(58) Field of Classification Search .............. 29/25.35, 29/594, 830, 831, 832; 310/328, 333, 294.4; 156/330, 291; 360/294.4, 294.3
See application file for complete search history.

(56) References Cited

U.S. PATENT DOCUMENTS

| 3,545,283 | A | | 12/1970 | McGunigle | 73/517 |
| 4,240,002 | A | | 12/1980 | Tosi et al. | 310/324 |
| 4,680,595 | A | | 7/1987 | Cruz-Uribe et al. | 346/140 R |
| 4,761,582 | A | | 8/1988 | McKee | 310/322 |
| 5,073,521 | A | * | 12/1991 | Braden | 29/827 |
| 5,117,279 | A | * | 5/1992 | Karpman | 257/793 |

(Continued)

FOREIGN PATENT DOCUMENTS

JP 10-293979 11/1998

(Continued)

*Primary Examiner*—A. Dexter Tugbang
*Assistant Examiner*—Tai Van Nguyen
(74) *Attorney, Agent, or Firm*—Greer, Burns & Crain, Ltd.

(57) ABSTRACT

In a method of producing a micro-actuator, a first adhesive is applied to a movable plate, and a movable, and a movable electrode is placed on the first adhesive. A second adhesive is applied to the movable electrode, and a piezoelectric element is placed on the second adhesive. Next, a third adhesive is applied to an actuator base, a base electrode is placed on the third adhesive, and the third adhesive is semi-cured in the same manner as above. A fourth adhesive is applied to the base electrode, the piezoelectric element is placed on the fourth adhesive, and the fourth adhesive is semi-cured in the same manner as above. Finally, the adhered laminate thus obtained is placed into a heating furnace and heated at a predetermined temperature for a predetermined period of time to thereby fully cure the adhesives.

4 Claims, 13 Drawing Sheets

U.S. PATENT DOCUMENTS

| | | |
|---|---|---|
| 5,311,219 A | 5/1994 | Ochiai et al. ............ 346/140 R |
| 5,376,856 A | 12/1994 | Takeuchi et al. ............ 310/328 |
| 5,408,376 A | 4/1995 | Nishikura et al. .......... 360/109 |
| 5,444,324 A | 8/1995 | Priest et al. ................. 310/334 |
| 5,594,475 A | 1/1997 | Komakine et al. ............. 347/9 |
| 5,631,680 A | 5/1997 | Sugahara ...................... 347/69 |
| 5,689,064 A * | 11/1997 | Kennedy et al. .............. 73/105 |
| 5,933,709 A * | 8/1999 | Chun .......................... 438/122 |
| 6,327,120 B1 | 12/2001 | Koganezawa et al. ... 360/294.4 |
| 6,653,761 B2 * | 11/2003 | Fujii et al. ................... 310/333 |

FOREIGN PATENT DOCUMENTS

| | | |
|---|---|---|
| JP | 11-031368 | 2/1999 |

* cited by examiner

F I G. 4 A
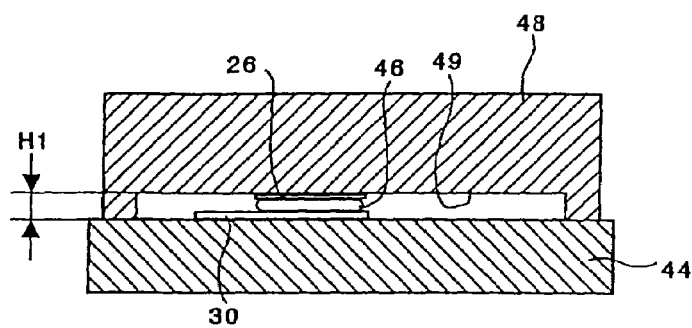
F I G. 4 B
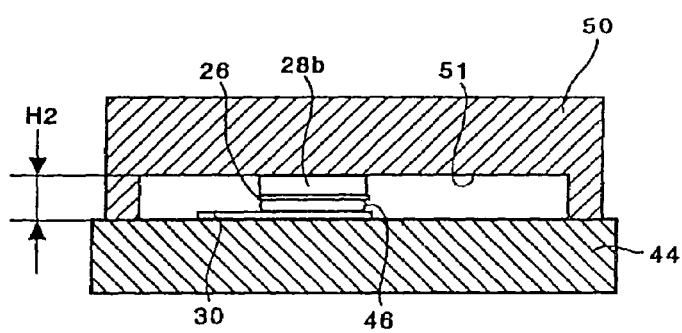
F I G. 4 C
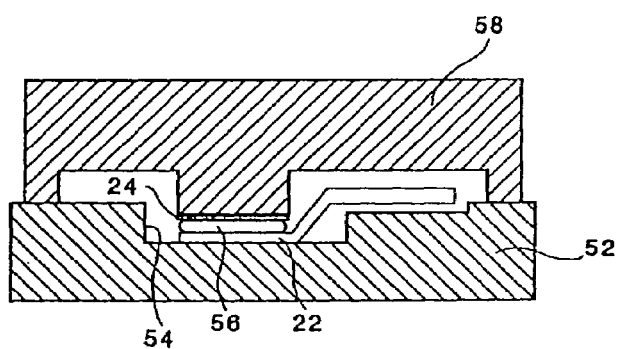
F I G. 4 D
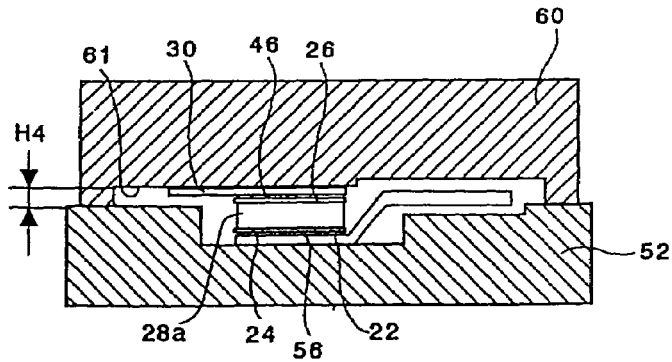

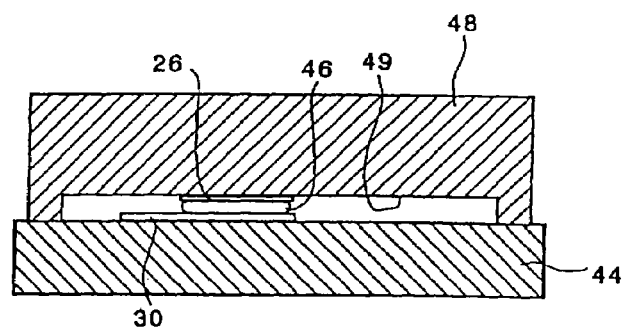
F I G. 1 1 A
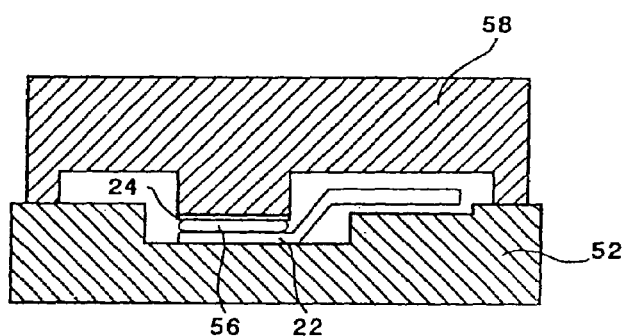
F I G. 1 1 B
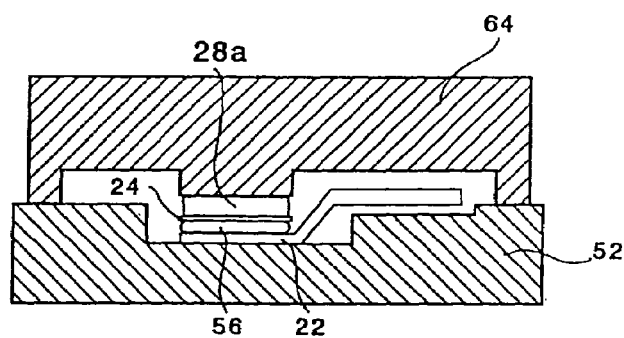
F I G. 1 1 C
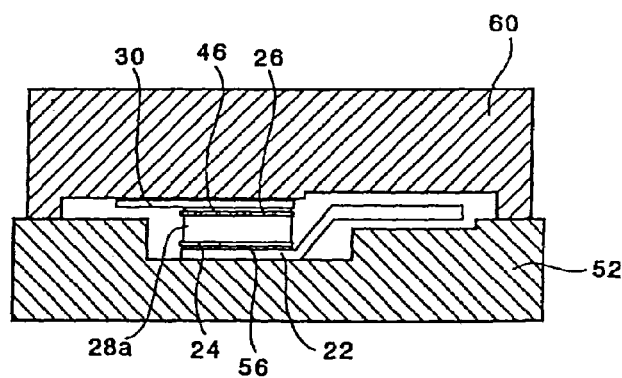
F I G. 1 1 D

METHOD OF PRODUCING A MICRO-ACTUATOR

This is a Divisional of application Ser. No. 10/459,955, filed Jun. 12, 2003 now U.S. Pat. No. 6,848,154 which is a divisional of application Ser. No. 09/822,621 filed Mar. 30, 2001, now U.S. Pat. No. 6,653,761.

BACKGROUND OF THE INVENTION

1. Field of the Invention

The present invention relates to a micro-actuator for fine movement of a magnetic head and to a method of producing the same.

2. Description of the Related Art

In recent years, reductions in size and thickness of magnetic disk devices, a kind of external storage device for computers, have been under way and, further, reduction in electric power consumption is requested. In addition, magnetic disk devices with higher recording density and larger capacity are demanded. Larger capacity of the magnetic disk devices can generally be realized by increasing the recording capacity per disk. However, an increase in recording density without changing the diameter of the disk leads to narrower track pitch; accordingly, the technical problem is how accurate the head device for reading and writing data on record tracks is positioned, and a head actuator with good positioning accuracy is desired.

Hitherto, in order to position a head with high accuracy in a magnetic disk device, generally, trials have been made to enhance rigidity of movable portions such as an actuator arm and raise the main resonance point frequency in in-plane directions. However, improvement of resonance point has a limit, and even if the in-plane resonance point of the movable portion can be raised, there is still the problem that vibration is generated due to spring characteristics of a bearing supporting the movable portion, resulting in a reduction of positioning accuracy.

As means for solving the above problem, a so-called two-stage actuator in which a second actuator for following the tracks, namely, a tracking actuator is mounted on the tip of an arm of a head actuator, has been proposed. The tracking actuator is for minutely moving the head provided at a tip portion of an arm, independently from motions of the head actuator, to achieve tracking of the head.

A two-stage actuator in which accurate positioning of the head is accomplished by utilizing laminate type piezoelectric elements as the tracking actuator for the two-stage actuator has been proposed. For example, two laminate type piezoelectric elements are disposed on both sides of an actuator arm, and a voltage is impressed in such a direction that the piezoelectric element on one side is elongated while the piezoelectric element on the other side shrinks, whereon the head is rotated in the direction of the piezoelectric element shrinking under the impressed voltage.

However, in the two-stage actuator utilizing the laminate type piezoelectric element according to the prior art, depolarization of the piezoelectric element occurs due to impression of a voltage in the direction reverse to the polarization direction of the piezoelectric element, exposing of the piezoelectric element to a high-temperature atmosphere, aging or the like; as a result, displacement per unit voltage gradually diminishes. Therefore, there is the problem that when the system is used for a certain long time, a desired stroke cannot be obtained. Furthermore, the two-stage actuator according to the prior art utilizing the laminate type piezoelectric elements has the disadvantage that productivity of the laminate type piezoelectric elements is bad, and high accuracy or precision of outer sizes of the elements is required, leading to high cost.

Two-stage actuators utilizing a shearing type piezoelectric element in place of the laminate type piezoelectric element having the above-mentioned many problems have been proposed in Japanese Patent Laid-open No. Hei 10-293979 and Japanese Patent Laid-open No. Hei 11-31368. A minute moving mechanism for head disclosed in the Japanese Patent Laid-open No. Hei 11-31368 has a three-layer structure in which two shearing type piezoelectric elements having different polarization directions are mounted on an electrode formed at the tip of a head arm, and a head suspension is mounted thereon through a movable member therebetween.

Therefore, this structure has a larger thickness from the head arm to the suspension, as compared with the conventional structure in which the suspension is fitted to the head arm with only a spacer. Thus, the two-stage actuator with the three-layer structure is unsuitable for reduction in thickness of the head actuator. Further, the increased thickness leads to greater distance between disk surfaces, whereby the number of disks mountable in the disk device is decreased, and storage capacity is also decreased as compared with the conventional disk device having the same height.

A minute moving mechanism for head which solves the above-mentioned problems has been proposed by the present applicant. In the invention of the previous application, an actuator base bent in a crank shape is fixed to a tip portion of an actuator arm. A base electrode, a shearing type piezoelectric element, a movable electrode and a movable plate are laminated and fixed on the actuator base, and a suspension is fixed to the movable plate. With the actuator base bent in a crank shape, the top surface of the actuator base and the top surface of the movable plate can be flush with each other, so that the minute moving mechanism for head utilizing the shearing type piezoelectric element can be made thinner.

In the invention of the previous application, electrical conduction must be provided between the shearing type piezoelectric element and the base electrode and the movable electrode, and, therefore, the base electrode and the movable electrode have been fixed to the piezoelectric element by use of a conductive adhesive. On the other hand, electrical insulation must be kept between the actuator base and the base electrode and between the movable electrode and the movable plate, and, therefore, fixation between the actuator base and the base electrode and between the movable electrode and the movable plate has been made by use of an ordinary insulating adhesive.

In the method of producing a micro-actuator using a conductive adhesive and an ordinary insulating adhesive according to the invention of the previous application, it is needed to selectively use the two types of adhesive, which leads to complicated production steps. Further, use of a conductive adhesive may easily be attended by generation of a short-circuit due to a mistake in production process. Thus, it is contemplated to contrive use of a single adhesive by using an insulating adhesive also for adhesion of the electrode and the piezoelectric element. However, where an adhesive is merely applied and cured, an adhesive layer thin enough to obtain electrical connection cannot be formed.

Therefore, a method of applying a pressure at the time of curing the adhesive is contemplated. However, where pressure is merely applied upon each lamination of component parts through an adhesive, the thickness of the adhesive layer on application of pressure is added to the thickness of component parts, so that variations of the thickness of the component parts will come out as large variations of the total thickness. Further, where electrical connection is envisioned, two shearing type piezoelectric elements are mounted on the base electrode, and the difference between the thicknesses of left and right piezoelectric elements may cause variations of the adhesive layer even if they are pressed in the same manner.

SUMMARY OF THE INVENTION

Accordingly, it is an object of the present invention to provide a method of producing a micro-actuator using a method of adhesion capable of securely providing electrical connection as required, irrespectively of variations of component parts.

It is another object of the present invention to provide a micro-actuator capable of selectively providing electrical connection and electrical insulation as required while using the same adhesive.

In accordance with an aspect of the present invention, there is provided a method of producing a micro-actuator, comprising the steps of: applying a first adhesive to a movable plate; placing a movable electrode on the first adhesive; clamping the movable plate and the movable electrode between a first stage and a first head, followed by heating for a first predetermined period of time while exerting a first predetermined press load onto the first head to semi-cure the first adhesive; applying a second adhesive to the movable electrode; placing a piezoelectric element on the second adhesive; clamping the movable plate, the movable electrode and the piezoelectric element between the first stage and a second head, followed by heating for a second predetermined period of time while exerting a second predetermined press load onto the second head to semi-cure the second adhesive; applying a third adhesive to an actuator base; placing a base electrode on the third adhesive; clamping the actuator base and the base electrode between a second stage and a third head, followed by heating for a third predetermined period of time while exerting a third predetermined press load onto the third head to semi-cure the third adhesive; applying a fourth adhesive to the base electrode; placing the piezoelectric element on the fourth adhesive; and clamping the actuator base, the base electrode, the piezoelectric element, the movable electrode and the movable plate between the second stage and a fourth head, followed by heating for a fourth predetermined period of time while exerting a fourth predetermined press load onto the fourth head to semi-cure the fourth adhesive.

Preferably, the first to fourth adhesives comprise a thermo-setting epoxy resin. Further preferably, the first to fourth adhesives are applied by use of a plurality of pins.

In accordance with another aspect of the present invention, there is provided a method of producing a micro-actuator, comprising the steps of: applying a first adhesive to a movable plate; placing a movable electrode on the first adhesive; clamping the movable plate and the movable electrode between a first stage and a first head, followed by heating for a first predetermined period of time while exerting a first predetermined press load onto the first-head to semi-cure the first adhesive; applying a second adhesive to an actuator base; placing a base electrode on the second adhesive; clamping the actuator base and the base electrode between a second stage and a second head, followed by heating for a second predetermined period of time while exerting a second predetermined press load onto the second head to semi-cure the second adhesive; applying a third adhesive to the base electrode; placing a piezoelectric element on the third adhesive; clamping the actuator base, the base electrode and the piezoelectric element between the second stage and a third head, followed by heating for a third predetermined period of time while exerting a third predetermined press load onto the third head to semi-cure the third adhesive; applying a fourth adhesive to the piezoelectric element; placing the movable electrode on the fourth adhesive; and clamping the actuator base, the base electrode, the piezoelectric element, the movable electrode and the movable plate between the second stage and a fourth head, followed by heating for a fourth predetermined period of time while exerting a fourth predetermined press load onto the fourth head to semi-cure the fourth adhesive.

In accordance with a further aspect of the present invention, there is provided a micro-actuator comprising: an actuator base; a base electrode adhered to the actuator base by a first adhesive; first and second shearing-type piezoelectric elements having polarization directions opposite to each other and perpendicular to the element thickness direction, adhered to the base electrode by a second adhesive; a movable electrode adhered to the first and second piezoelectric element by a third adhesive; and a movable plate adhered to the movable electrode by a fourth adhesive, wherein the second and third adhesives are thin enough to allow electrical conduction respectively between the first and second piezoelectric elements and the base electrode and between the first and second piezoelectric elements and the movable electrode; and the first and fourth adhesives are thick enough to provide electrical insulation respectively between the actuator base and the base electrode and between the movable plate and the movable electrode.

Preferably, the first to fourth adhesives comprise a thermo-setting epoxy resin, and the second and third adhesives have a thickness of not more than 3 µm.

In accordance with a still further aspect of the present invention, there is provided a method of producing a micro-actuator, comprising the steps of: applying a first adhesive to an actuator base; placing a base electrode on the first adhesive; clamping the actuator base and the base electrode between a first stage and a first head, followed by heating for a first predetermined period of time while exerting a first predetermined press load onto the first head to semi-cure the first adhesive; applying a second adhesive to the base electrode; placing a piezoelectric element on the second adhesive; clamping the actuator base, the base electrode and the piezoelectric element between the first stage and a second head, followed by heating for a second predetermined period of time while exerting a second predetermined press load onto the second head to semi-cure the second adhesive; applying a third adhesive to the piezoelectric element; placing a movable plate on the third adhesive; and clamping the actuator base, the base electrode, the piezoelectric element and the movable plate between a second stage having a first suction hole and a third head having a second suction hole, followed by heating for a third predetermined period of time while drawing under vacuum through the first and second suction holes and exerting a third predetermined press load onto the third head to semi-cure the third adhesive.

In accordance with a still further aspect of the present invention, there is provided a micro-actuator comprising: an actuator base; a base electrode adhered to the actuator base by a first adhesive; first and second shearing-type piezoelectric elements having polarization directions opposite to each other and perpendicular to the element thickness direction, adhered to the base electrode by a second adhesive; a movable plate adhered to the first and second piezoelectric elements by a third adhesive; a first wire for connecting the first and second piezoelectric elements; and a second wire for connecting either one of the first and second piezoelectric elements to the base electrode, wherein the base electrode comprises a first conductor pattern electrically connected to the first and second piezoelectric elements through the second adhesive, and a second conductor pattern electrically independent from the first conductor pattern and connected to the second wire, the second adhesive is thin enough to allow electrical conduction between the base electrode and the first and second piezoelectric elements, and the first and third adhesives are thick enough to provide electrical insulation respectively between the actuator base and the base electrode and between the movable plate and the first and second piezoelectric elements.

Preferably, the second adhesive comprises a thermosetting epoxy resin, and has a thickness of not more than 3 µm.

In accordance with a still further aspect of the present invention, there is provided a method of adhering a plurality of members, comprising the steps of: applying a first adhesive to a first member; placing a second member on the first adhesive; clamping the first and second members between a first stage and a first head, followed by heating for a first predetermined period of time while exerting a first predetermined press load onto the first head to semi-cure the first adhesive; applying a second adhesive to the second member; placing a third member on the second adhesive; and clamping the first member, the second member and the third member between the first stage and a second head, followed by heating for a second predetermined period of time while exerting a second predetermined press load onto the second head to semi-cure the second adhesive.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIGS. 4A to 4D are views illustrating a method of producing the piezo micro-actuator according to the first embodiment;

FIGS. 11A to 11D are views showing another method of producing the piezo micro-actuator according to the first embodiment;

DETAILED DESCRIPTION OF THE PREFERRED EMBODIMENTS

Figure 1A:
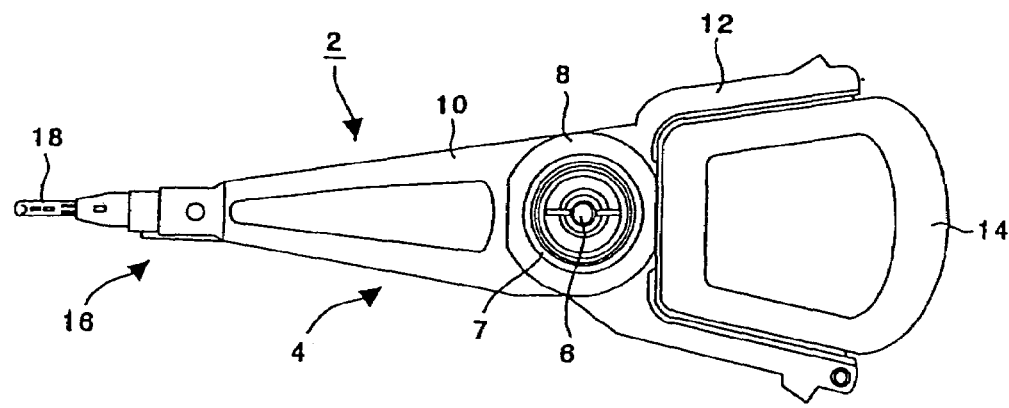
FIG. 1A is a plan view of a two-stage actuator utilizing a piezo micro-actuator according to the present invention.
Figure 1B:
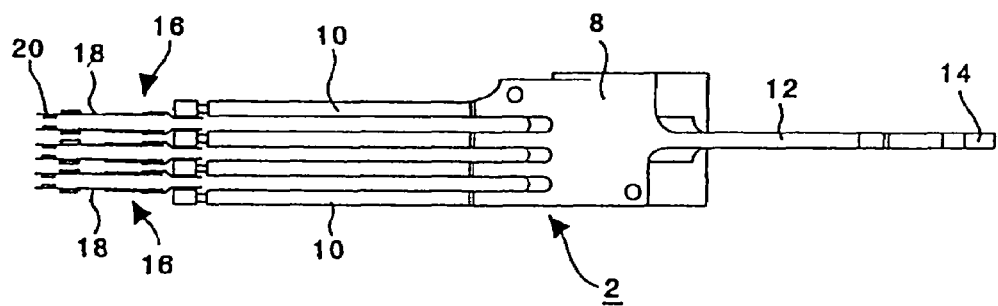
FIG. 1B is a side view of the same.

Now, embodiments of the present invention will be described in detail referring to the drawings. Referring to FIG. 1A, there is shown a plan view of a two-stage head actuator adopting a piezo micro-actuator of the invention as a tracking actuator. FIG. 1B is a side view of the same.

Numeral 2 denotes the two-stage head actuator comprised of an actuator assembly 4 and a magnetic circuit (not shown). The actuator assembly 4 is rotatably fitted on a shaft 6 fixed to a base (not shown) of a magnetic disk device. The actuator assembly 4 comprises an actuator block 8 rotatably fitted to the shaft 6 through a bearing 7, a plurality of actuator arms 10 formed as one body with the actuator block 8 and extended in one direction, and a coil support member 12 extended in a direction opposite to the actuator arms 10.

A flat coil 14 is supported on the coil support member 12, and the magnetic circuit (not shown) fixed to a base of the magnetic disk device and the coil 14 inserted in a gap of the magnetic circuit constitute a voice coil motor (VCM). A piezo micro-actuator 16 according to the invention is fitted to a tip portion of each of the actuator arms 10, and a base end portion of a suspension 18 is fixed to the piezo micro-actuator 16. A tip portion of the suspension 18 supports a magnetic head 20.

Figure 2:
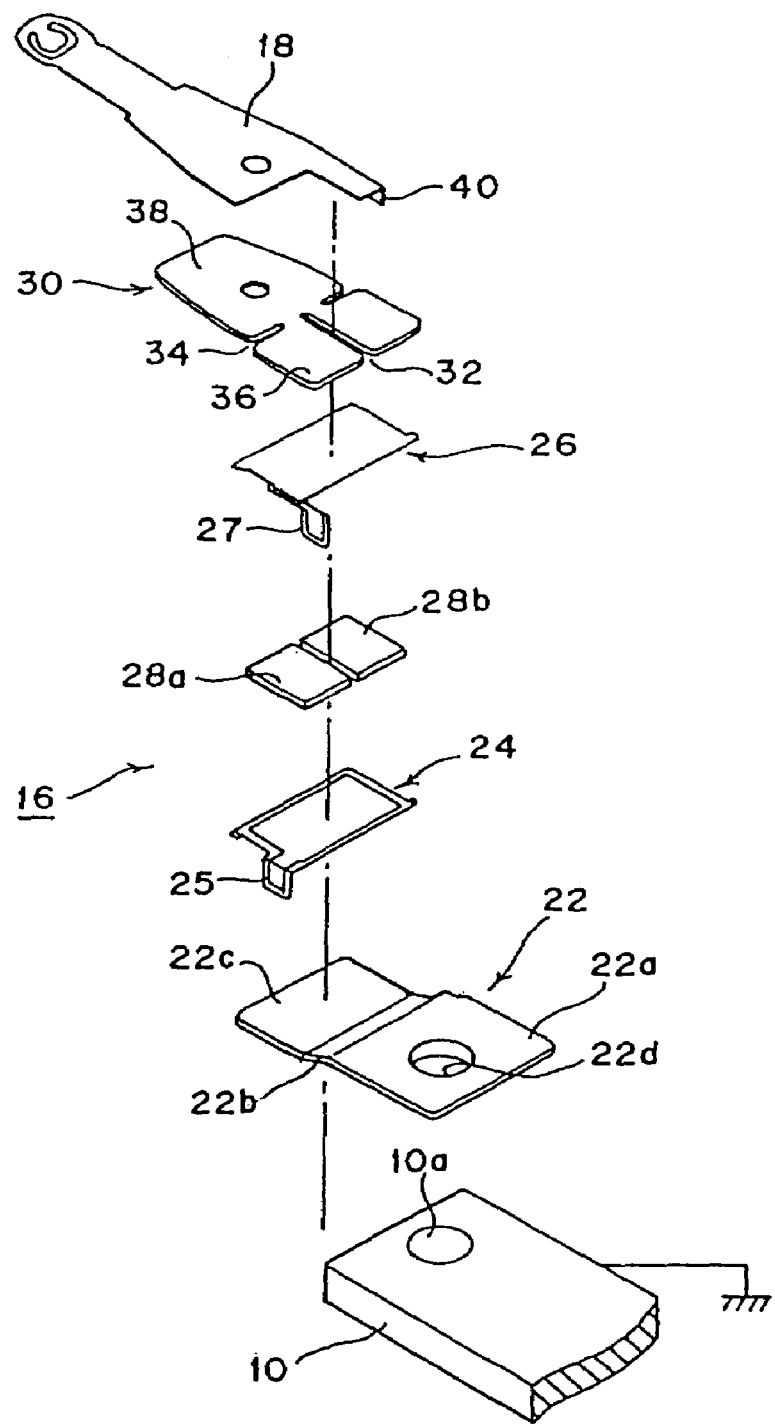
FIG. 2 is an exploded perspective view of a piezo micro-actuator according to a first embodiment of the invention.

Referring to FIG. 2, there is shown an exploded perspective view of a piezo micro-actuator 16 according to a first embodiment of the invention. A fixing portion 22a of an actuator base 22 is fixed by inserting a caulking projection 22d formed as one body with the fixing portion 22a into a caulking hole 10a bored in the actuator arm 10, followed by caulking. The actuator arm 10 is grounded. A tip portion 22c of the actuator base 22 is formed lower than the fixing portion 22a with a step portion 22b therebetween, and a pair of shearing type piezoelectric elements 28a, 28b clamped between a base electrode 24 and a movable electrode 26 are mounted on the tip portion 22c. The pair of shearing type piezoelectric elements 28a, 28b have polarization directions opposite to each other and perpendicular to the element thickness direction. The polarization directions are parallel to the longitudinal direction of the actuator arm 10.

The base electrode 24 is provided with a tab (wiring lead portion) 25 projected sideways from the tip portion 22c of the actuator base 22. Similarly, the movable electrode 26 is provided with a tab 27 projected sideways from the tip portion 22c of the actuator base 22. A movable plate 30 has a base portion 36, defined by a first notch 32 and a second notch 34, and a movement amount enlarging portion 38. The base portion 36 of the movable plate 30 is fitted to the movable electrode 26, and the suspension 18 is fixed to the movement amount enlarging portion 38 of the movable plate 30 by spot welding or the like. Numeral 40 denotes a relay FPC fitting portion provided on a side of the base end portion of the suspension 18.

Figure 3A:
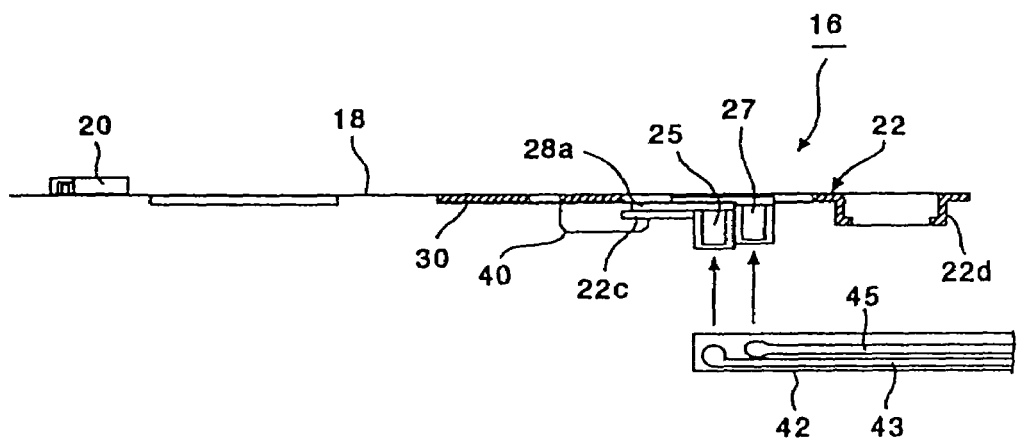
FIG. 3A is a side view of a head assembly adopting the piezo micro-actuator according to the first embodiment.
Figure 3B:
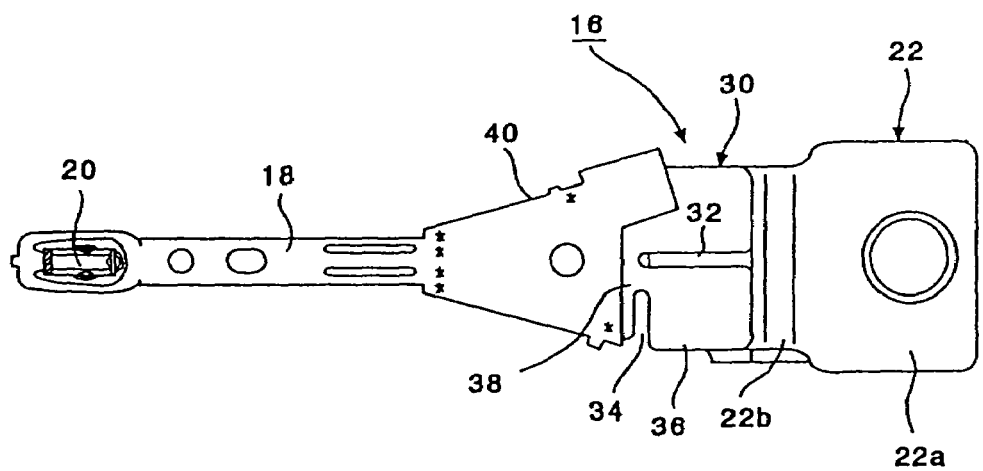
FIG. 3B is a plan view of the same.

Referring to FIG. 3A, there is shown a side view of a head assembly adopting the piezo micro-actuator 16 according to the first embodiment. FIG. 3B is a plan view of the same. As shown in FIG. 3A, when the piezo micro-actuator 16 is assembled, the tab 25 of the base electrode 24 and the tab 27 of the movable electrode 26 are disposed adjacent to each other. As a result, soldering of a relay FPC 42 provided with lead patterns 43, 45 for the tabs 25, 27 becomes easy, and it is easy to apply a voltage to the base electrode 24 and the movable electrode 26.

Next, referring to FIGS. 4A to 4D, a first method of producing the piezo micro-actuator according to the first embodiment of the present invention will be described. First, as shown in FIG. 4A, the movable plate 30 is mounted on a first stage 44 having a flat top face, and a first adhesive 46 comprising a thermo-setting epoxy resin is applied to the movable plate 30. Next, the movable electrode 26 is mounted on the first adhesive 46. A first head 48 is mounted on the first stage 44, thereby clamping the movable plate 30 and the movable electrode 26 between the first stage 44 and the first head 48. The first head 48 has a groove 49 having a depth H1=152 µm.

The first head 48 incorporates a heater, and is heated to about 120° C. The first stage 44 is mounted on a heating plate and is heated while exerting a predetermined press load, for example, about 43 Newtons to the first head 48. The first stage 44 was heated up to 120° C. after about 90 seconds, and maintained at that temperature for 120 seconds, whereby the first adhesive 46 was semi-cured. Next, a second adhesive comprising a thermo-setting epoxy resin is applied to the movable electrode 26, and a pair of piezoelectric elements 28a, 28b are mounted on the second adhesive.

Next, as shown in FIG. 4B, the second adhesive was heated and semi-cured while exerting a press load of 43 Newtons to a second head having a groove 51 having a depth H2=290 µm. In the same manner as the step shown in FIG. 4A, the adhesive curing temperature was 120° C. and the heating time was 210 seconds. In the pressing step shown in FIG. 4B, the first adhesive 46 formed somewhat thicker can be utilized as a cushion and, therefore, variations in the height of the piezoelectric elements 28a, 28b can be absorbed by sinking of the first adhesive 46. Further, by setting the depth H2 of the groove 51 at an appropriate value as mentioned above, the second adhesive can be formed very thin to have a thickness of not more than 3 µm, and electrical connection can be secured between the movable electrode 26 and the piezoelectric elements 28a, 28b.

Figure 5:
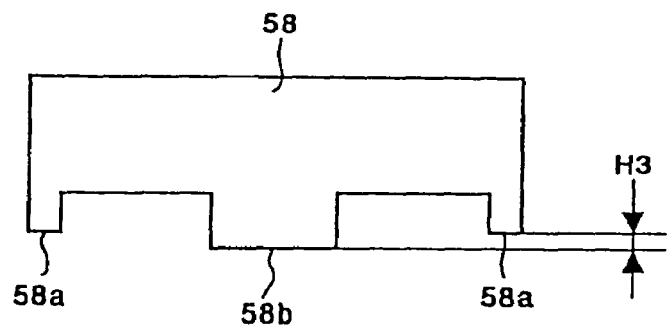
FIG. 5 is a view showing the size relationships of a third head.

Next, as shown in FIG. 4C, the actuator base 22 is mounted on a second stage 52 having a groove 54. The depth of the groove 54 is 220 µm. A third adhesive 56 also comprising a thermo-setting epoxy resin is applied to the actuator base 22, and the base electrode 24 is placed on the third adhesive 56. A third head 58 is mounted on the second stage 52 to clamp the actuator base 22 and the base electrode 24 between the second stage 52 and the third head 58. As shown in FIG. 5, the third head 58 has a pair of end projections 58a and a central projection 58b, and height difference H3 between the end projections 58a and the central projection 58b is 50 µm. The third adhesive 56 was heated and semi-cured while exerting a press load of 43 Newtons onto the third head 58. The adhesive curing temperature and heating time were the same as in the step shown in FIG. 4A; namely, the adhesive curing temperature was 120° C. and the heating time was 210 seconds.

Next, a fourth adhesive also comprising a thermo-setting epoxy resin is applied to the base electrode 24. Further, as shown in FIG. 4D, the laminate or adhered body obtained in the step of FIG. 4B is inverted, and the piezoelectric elements 28a, 28b are mounted on the fourth adhesive. A fourth head 60 is mounted on the second stage 52 to clamp the actuator base 22, base electrode 24, piezoelectric elements 28a, 28b, movable electrode 26 and movable plate 30 between the second stage 52 and the fourth head 60. The fourth head 60 has a groove 61 having a depth H4=200 µm.

The fourth adhesive was semi-cured by heating a predetermined period of time while exerting a press load of 43 Newtons on the fourth head 60. The adhesive curing temperature and heating time were the same as in the step of FIG. 4A; namely, the adhesive curing temperature was 120° C. and heating time was 210 seconds. In the step shown in FIG. 4D, the third adhesive 56 formed somewhat thicker can be utilized as a cushion and, therefore, thickness variations of component parts can be absorbed. Further, by setting the depth H4 of the groove 61 at an appropriate value mentioned above, the fourth adhesive can be formed very thin to have a thickness of not more than 3 µm, and it is possible to secure electrical connection between the base electrode 24 and the piezoelectric elements 28a, 28b. Finally, the adhered laminate obtained in FIG. 4D was placed into a heating furnace, and heated at 120° C. for about 30 minutes, whereby the first to fourth adhesives were fully cured.

Figure 6:
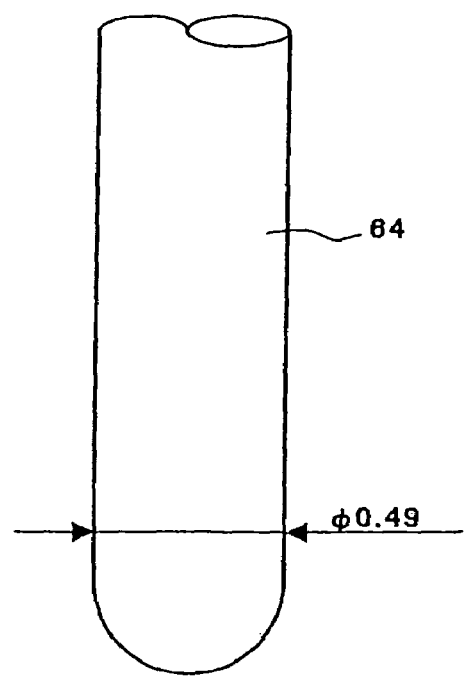
FIG. 6 is a view showing the shape of a transfer pin.
Figure 7A:
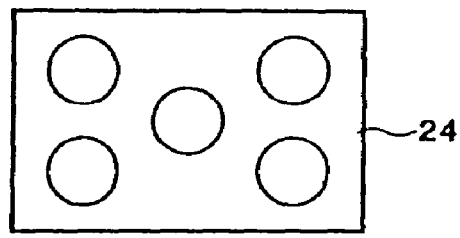
FIG. 7A is a view showing the position of transferring an adhesive to a base electrode.
Figure 7B:
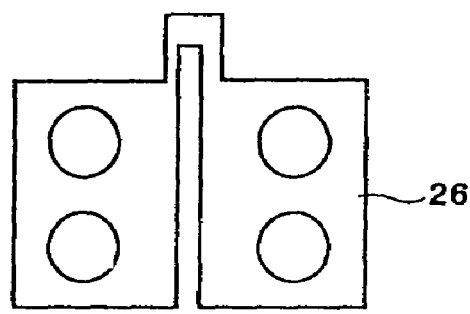
FIG. 7B is a view showing the position of transferring an adhesive to a movable electrode.
Figure 7C:
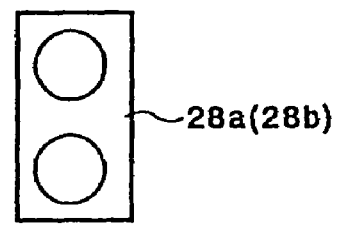
FIG. 7C is a view showing the position of transferring an adhesive to a piezoelectric element.

In order to control the amount of adhesives applied to component parts, application of the adhesives was carried out by a pin transfer system in which a plurality of transfer pins 64 as shown in FIG. 6 were used. Each of the pins has a diameter of 0.49 mm. The plurality of transfer pins 64 shown in FIG. 6 are pressed against an adhesive layer extended by a squeezee to a thickness of 100 to 150 µm, thereby applying the adhesive to the transfer pins 64. The transfer pins 64 are pressed against transfer positions shown by circles in FIGS. 7A to 7C, thereby applying the adhesive to component parts. The adhesive is applied to the base electrodes 24 at five points as shown in FIG. 7A, is applied to the movable electrode 26 at four points as shown in FIG. 7B, and is applied to the piezoelectric element 28a or 28b at two points as shown in FIG. 7C. In fact, the adhesive is applied to the actuator base 22 in place of the base electrode 24, is applied to the movable plate 30 in place of the movable electrode 26, and is applied to the movable electrode 26 and the base electrode 24 in place of the piezoelectric element 28a, 28b.

Figure 8:
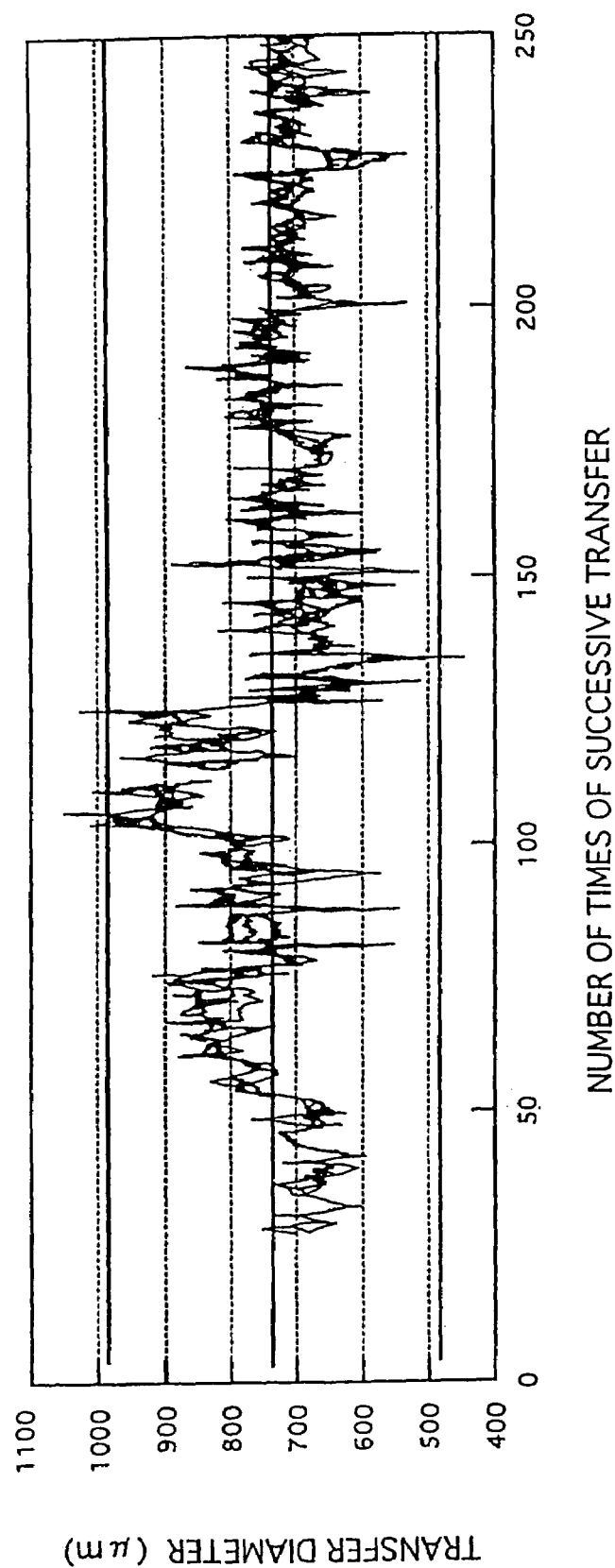
FIG. 8 is a diagram showing the relationship between the number of times of successive transfer and transfer diameter of an adhesive.
Figure 9:
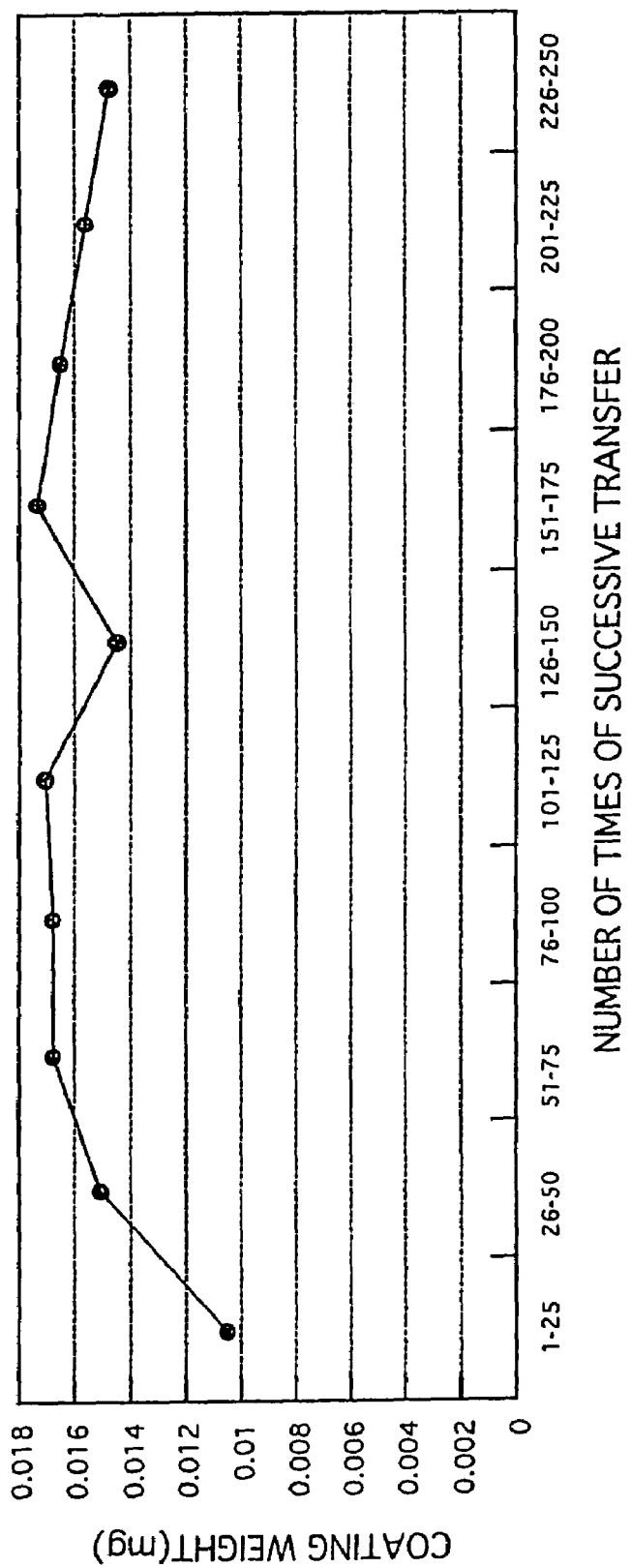
FIG. 9 is a diagram showing the relationship between the number of times of successive transfer and coating weight of an adhesive.

Referring to FIG. 8, there is shown the relationship between the number of times of successive transfer and transfer diameter of the adhesive. Although there are some dispersions, the pin transfer system provides a transfer diameter of about 700 µm. Referring to FIG. 9, there are shown the relationship between the number of times of successive transfer and coating weight of the adhesive. As is clear from FIG. 9, the adhesive can be stably applied with a coating weight of 0.016 mg for not less than 250 times, excepting the first several tens of times.

Figure 10:
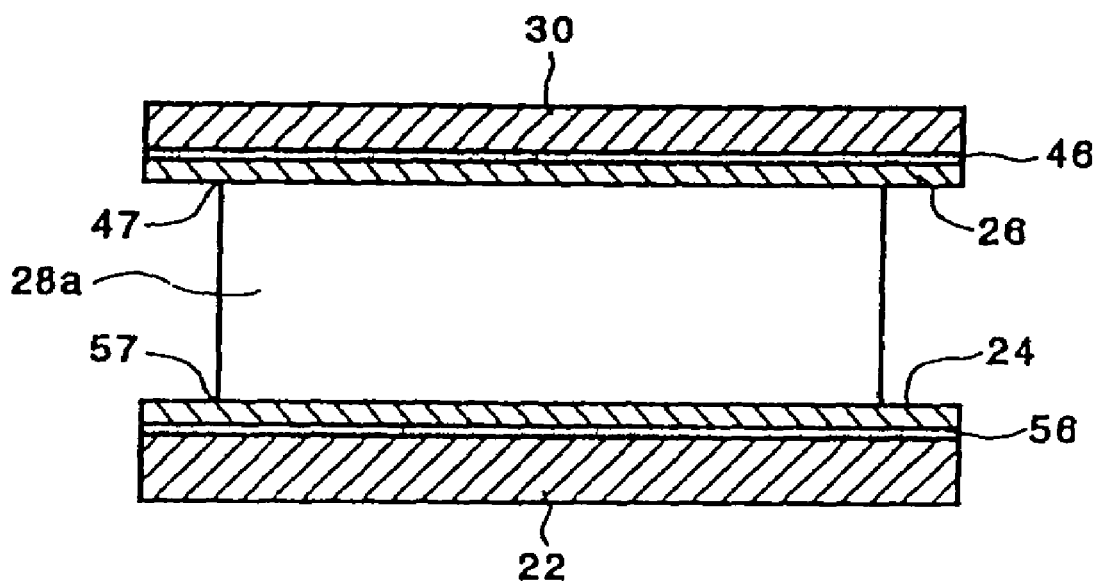
FIG. 10 is a schematic enlarged sectional view of a piezo micro-actuator after component parts are adhered.

Referring to FIG. 10, there is shown an enlarged sectional view of an adhered laminate after adhesion of component parts. As has been described above, the second adhesive 47 and the fourth adhesive 57 have a thickness of not more than 3 µm and, therefore, electrical conduction can be secured between the movable electrode 26 and the piezoelectric element 28a and between the base electrode 24 and the piezoelectric element 28a. In addition, since the first adhesive 46 and the third adhesive 56 have a sufficient thickness, insulation can be provided between the movable plate 30 and the movable electrode 26 and between the actuator base 22 and the base electrode 24.

Next, referring to FIGS. 11A to 11D, another method or a second method of producing the piezo micro-actuator according to the first embodiment of the invention will be described. The step shown in FIG. 11A is the same as the step shown in FIG. 4A, and the description thereof is omitted. Further, the step shown in FIG. 11B is the same as the step shown in FIG. 4C, and the description thereof is omitted.

Figure 12:
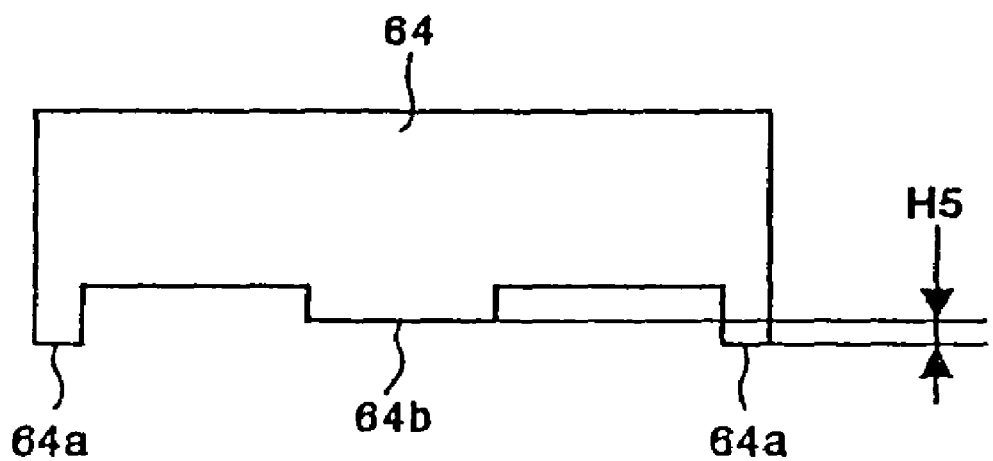
FIG. 12 is a view showing the size relationships of a fifth head.

According to the method in this embodiment, as shown in FIG. 11C, the piezoelectric elements 28a, 28b are adhered to the base electrode 24. Namely, a third adhesive is applied to the base electrode 24, and the piezoelectric elements 28a, 28b are mounted thereon. Next, a fifth head 64 is mounted on the second stage 52 to clamp the actuator base 22, base electrode 24 and piezoelectric elements 28a, 28b between the second stage 52 and the fifth head 64. As shown in FIG. 12, the fifth head 64 has a pair of end projections 64a and a central projection 64b, and the height difference H5 between the end projections 64a and the central projection 64b is 90 μm.

The third adhesive was semi-cured by heating at 120° C. for 210 seconds while exerting a press load of 43 Newtons to the fifth head 64. By setting the value of H5 at an appropriate value as mentioned above, the third adhesive can be formed very thin to have a thickness of not more than 3 μm, and electrical connection can be secured between the base electrode 24 and the piezoelectric elements 28a, 28b. Further, in the pressing step of FIG. 11C, the third adhesive 56 formed to be somewhat thicker can be utilized as a cushion and, therefore, the difference in thickness between the piezoelectric elements 28a, 28b can be absorbed.

The step shown in FIG. 11D is the same as the step shown in FIG. 4D and, therefore, description thereof is omitted. In the second method of production also, the laminate obtained in FIG. 11D was placed in a heating furnace, followed by heating at 120° C. for about 30 minutes to fully cure the adhesives. The first and second methods differ from each other in that the piezoelectric elements 28a, 28b are first adhered to the movable electrode 26 as shown in FIG. 4B in the first method, whereas the piezoelectric elements 28a, 28b are first adhered to the base electrode 24 as shown in FIG. 11C in the second method.

When the piezo micro-actuator was produced by the first method of production, the yield was about 92%. Because the heating time is long, 16 pieces of each of the component parts of the piezo micro-actuator were joined into a sheet, and 16 pieces of piezo micro-actuators were produced at a time, to shorten the production time. The yield was similar to the above-mentioned percentage. In this case, the press load was 16 times of the value in the case of producing one piezo micro-actuator at a time, namely, about 680 Newtons, and the heating temperature and heating time period were the same as above. Since 16 sets were processed at a time, the heating time per set could be shortened to about 13 seconds. Since the application of adhesives was carried out by the pin transfer system, 16 sets could be processed at a time, and process time could be shortened as compared with a dispensing system.

Figure 13:
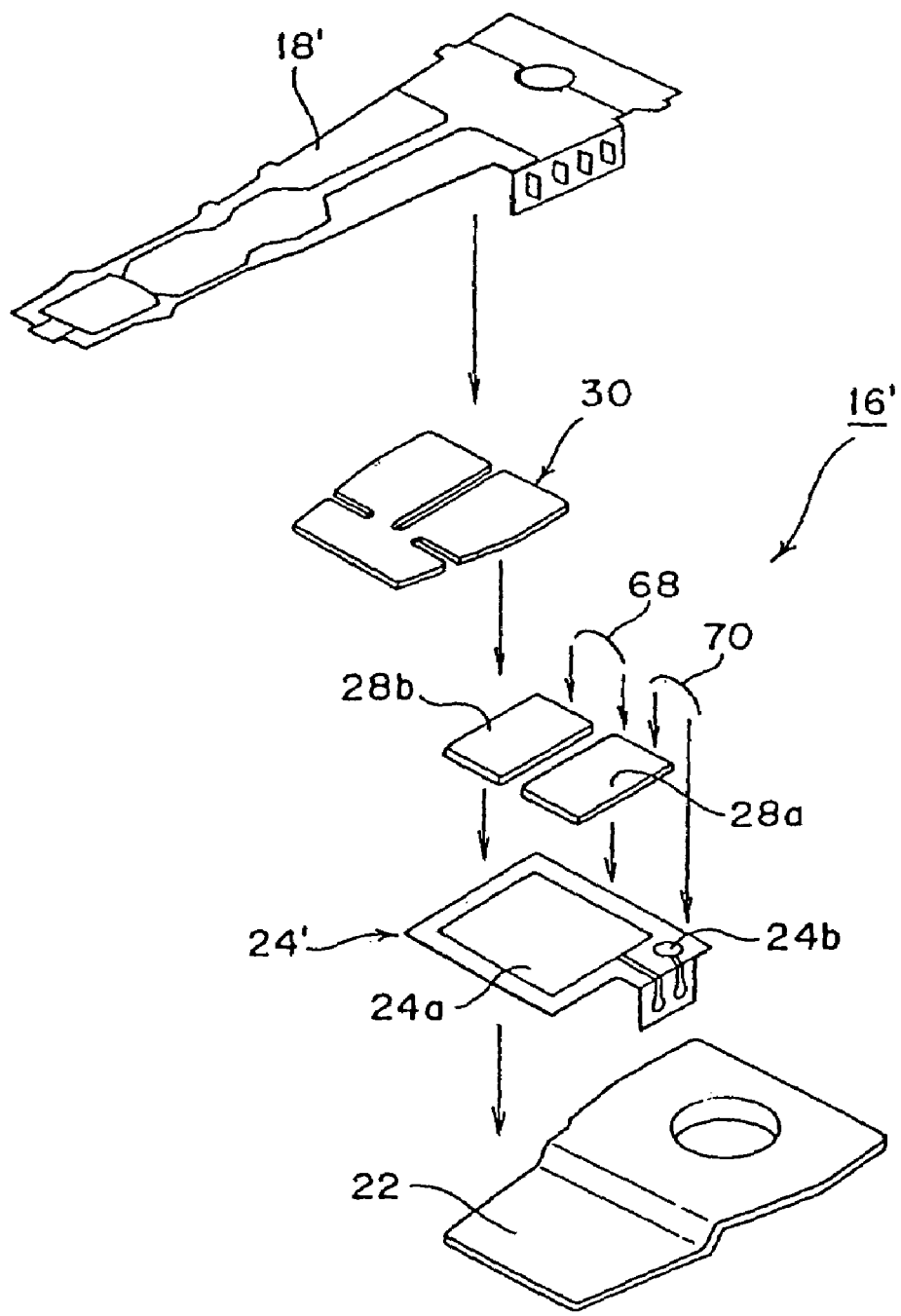
FIG. 13 is an exploded perspective view of a piezo micro-actuator according to a second embodiment of the invention.

Referring to FIG. 13, there is shown an exploded perspective view of a piezo micro-actuator according to a second embodiment of the invention. A base electrode 24' is adhered to an actuator base 22. The base electrode 24' has a large first conductor pattern 24a and a small-area second conductor pattern 24b independent from the first conductor pattern 24a. A pair of shearing type piezoelectric elements 28a, 28b are adhered to the base electrode 24'. The pair of piezoelectric elements 28a and 28b are bonding-connected by a first wire 68, while the piezoelectric element 28a and the second conductor pattern 24b of the base electrode 24' are bonding-connected by a second wire 70.

A movable plate 30 is adhered to the piezoelectric elements 28a, 28b. A suspension 18' is fixed to the movable plate 30 by spot welding or the like. In the piezo micro-actuator 16' of this embodiment, the movable electrode 26 in the first embodiment is omitted, and the pair of piezoelectric elements 28a, 28b are connected to the conductor pattern 24b of the base electrode 24' by the two wires 68, 70.

Figure 14A:
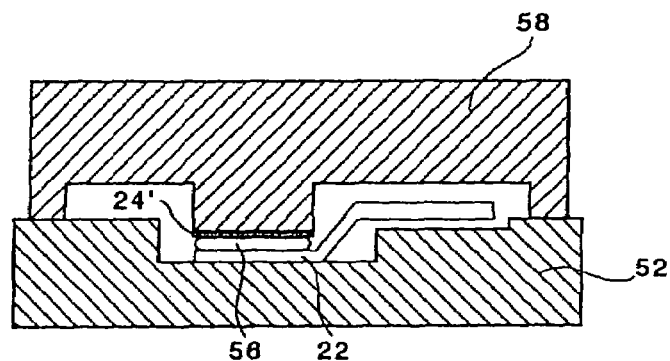
FIGS. 14A to 14C are views illustrating a method of producing the piezo micro-actuator according to the second embodiment.
Figure 14B:
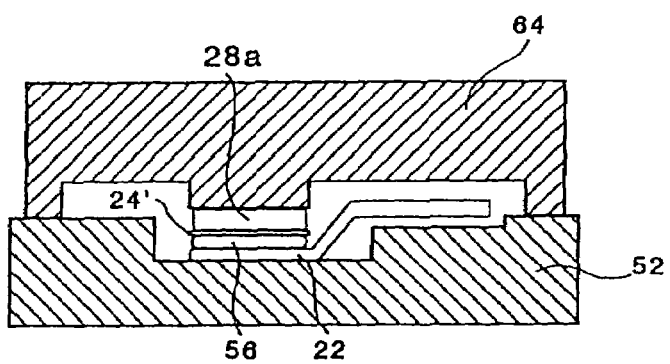
Figure 14C:
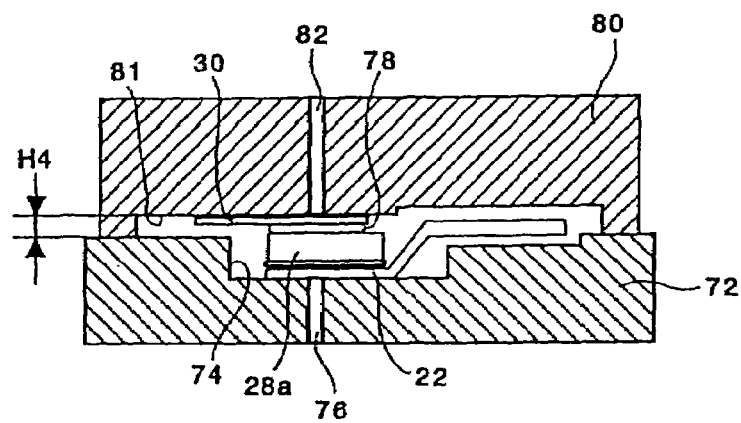

Referring to FIGS. 14A to 14C, a method of producing the piezo micro-actuator 16' according to the second embodiment will be described. First, as shown in FIG. 14A, the base electrode 24' is adhered to the actuator base 22 by a third adhesive 56. The pressing step of FIG. 14A is the same as the step of FIG. 11B and, therefore, description thereof is omitted. Next, as shown in FIG. 14B, the piezoelectric elements 28a, 28b are adhered to the base electrode 24' by a second adhesive. The pressing step of FIG. 14B is the same as the step of FIG. 11C and, therefore, description thereof is omitted.

Next, the adhered laminate obtained in FIG. 14B is mounted on a third stage 72 having a suction hole 76, as shown in FIG. 14C. Like the second stage 52, the third stage 72 has a groove 74 having a depth of 220 μm. An adhesive 78 comprising a thermo-setting epoxy resin is applied to the piezoelectric elements 28a, 28b by pin transfer, and a movable plate 30 is placed on the adhesive 78. Then, a sixth head 80 having a suction hole 82 is mounted on the third stage 72 to clamp the actuator base 22, base electrode 24, piezoelectric elements 28a, 28b and movable plate 30 between the third stage 72 and the sixth head 80. Like the fourth head 60, the sixth head 80 has a groove 81 having a depth H4.

The adhesive 78 was semi-cured by heating at 120° C. for 210 seconds while drawing under vacuum through the suction holes 76, 82 of the third stage 72 and the sixth head 80 and exerting a predetermined press load, namely a press load of 43 Newtons, to the sixth head 80. Heating and pressing while drawing under vacuum on the upper and lower sides is for securing the thickness of the adhesive 78. By this, a layer of the adhesive 78 with a thickness of about 20 μm can be formed. Then, the laminate obtained in FIG. 14C was placed in a heating furnace, followed by heating at 120° C. for about 30 minutes to thereby fully cure the adhesives.

Because the heating time is long, 16 pieces of each of component parts of the piezo micro-actuator 16' were joined into a sheet, and 16 pieces of the piezo micro-actuators 16' were produced at a time, thereby shortening production time. The yield was about 92%, the same as that in the case of producing the piezo micro-actuator one by one. The press load was 16 times that in the case of producing the piezo micro-actuator one by one, namely about 680 Newtons, and the heating temperature and heating time were the same as above. Since the 16 sets were processed at a time, the heating time per set could be shortened to about 13 seconds. Because the application of adhesive was carried out by the pin transfer system, 16 sets could be treated at a time, and production time could be shortened as compared with a dispensing system.

As is clear from the embodiments described above, the present invention is characterized in the method of adhering component parts or members while controlling the thickness of adhesive layers. While the above description has been made referring to an example of applying the adhesion method of the invention to production of a piezo micro-actuator, the present invention is not limited to the example, and can be applied to a method of adhering a plurality of members.

As has been detailed above, by controlling the thickness of adhesive layers according to the invention, it is possible to provide electrical connection and electrical insulation as required while using the same insulating adhesive, and to produce a micro-actuator with high yield.

What is claimed is:

1. A method of producing a micro-actuator, comprising the steps of:
    applying a first adhesive to an actuator base;
    placing a base electrode on said first adhesive;
    clamping said actuator base and said base electrode between a first stage and a first head, followed by heating for a first predetermined period of time while exerting a first predetermined press load onto said first head to semi-cure said first adhesive;
    applying a second adhesive to said base electrode;
    placing a piezoelectric element on said second adhesive;
    clamping said actuator base, said base electrode and said piezoelectric element between said first stage and a second head, followed by heating for a second predetermined period of time while exerting a second predetermined press load onto said second head to semi-cure said second adhesive;
    applying a third adhesive to said piezoelectric element;
    placing a movable plate on said third adhesive; and
    clamping said actuator base, said base electrode, said piezoelectric element and said movable plate between a second stage having a first suction hole and a third head having a second suction hole, followed by heating for a third predetermined period of time while drawing under vacuum through said first and second suction holes and exerting a third predetermined press load onto said third head to semi-cure said third adhesive.

2. A method of producing a micro-actuator as set forth in claim 1, wherein said first to third adhesives comprise a thermo-setting epoxy resin.

3. A method of producing a micro-actuator as set forth in claim 1, wherein said first to third adhesives are applied by use of a plurality of pins.

4. A method of producing a micro-actuator as set forth in claim 1, further comprising the step of heating the adhered laminate obtained in claim 1 at a predetermined temperature for a fourth predetermined period of time to filly cure said first to third adhesives.

* * * * *